(12) United States Patent  
Sugawara et al.

(10) Patent No.: US 8,149,276 B2  
(45) Date of Patent: Apr. 3, 2012

(54) PRESSURE-BONDED BALL DIAMETER DETECTING APPARATUS AND PRESSURE-BONDED BALL DIAMETER DETECTING METHOD

(75) Inventors: Kenji Sugawara, Tokyo (JP); Yong Chen, Tokyo (JP)

(73) Assignee: Shinkawa Ltd, Tokyo (JP)

( * ) Notice: Subject to any disclaimer, the term of this patent is extended or adjusted under 35 U.S.C. 154(b) by 0 days.

(21) Appl. No.: 12/963,874

(22) Filed: Dec. 9, 2010

(65) Prior Publication Data

US 2011/0128369 A1    Jun. 2, 2011

Related U.S. Application Data

(63) Continuation of application No. PCT/JP2008/072887, filed on Dec. 16, 2008.

(30) Foreign Application Priority Data

Jun. 13, 2008   (JP) .................................. 2008-154853

(51) Int. Cl.  
  *H04N 5/253*   (2006.01)
(52) U.S. Cl. ....................................... 348/87
(58) Field of Classification Search ........................ None  
  See application file for complete search history.

(56) References Cited

U.S. PATENT DOCUMENTS

| | | | |
|---|---|---|---|
| 5,474,224 A | 12/1995 | Nishimaki et al. | |
| 5,615,821 A | 4/1997 | Sasano | |
| 6,286,206 B1 * | 9/2001 | Li ................................... | 29/840 |
| 2008/0284042 A1 * | 11/2008 | Hotta et al. .................... | 257/775 |

FOREIGN PATENT DOCUMENTS

| | | |
|---|---|---|
| JP | 6-174442 | 6/1994 |
| JP | 7-37924 | 2/1995 |
| JP | 7-297220 | 11/1995 |
| JP | 11-211431 | 8/1999 |

OTHER PUBLICATIONS

International Search Report dated Feb. 3, 2009, from the corresponding International Application.  
Written Opinion of the International Searching Authority dated Feb. 3, 2009, from the corresponding International Application.

* cited by examiner

*Primary Examiner* — Nhon Diep  
(74) *Attorney, Agent, or Firm* — Katten Muchin Rosenman LLP (57) ABSTRACT

Improving detectability of a diameter of a pressure-bonded ball bonded by a bonding apparatus by calculating the diameter of the pressure-bonded ball by obtaining a first tentative radius by subtracting a distance between a line representing an outline of a pad short side and a curving line representing an outline of a pressure-bonded ball from a distance between the line representing the outline of the pad short side and a bonding-control-center position of the pressure-bonded ball; obtaining a second tentative radius by subtracting a distance between a line representing an outline of a pad short side that faces toward the pad with which the first tentative radius is calculated and an outline of a pressure-bonded ball from a distance between the line representing the outline of the pad short side and a bonding-control-center position of the pressure-bonded ball; and averaging the same number of the first and the second tentative radii.

2 Claims, 8 Drawing Sheets

PRESSURE-BONDED BALL DIAMETER DETECTING APPARATUS AND PRESSURE-BONDED BALL DIAMETER DETECTING METHOD

BACKGROUND OF THE INVENTION

1. Field of the Invention

The present invention relates to a pressure-bonded ball diameter detecting apparatus capable of detecting a diameter of a pressure-bonded ball bonded by a bonding apparatus and a pressure-bonded ball diameter detecting method.

2. Related Art

Wire-bonding apparatuses that connect between a pad as an electrode of a semiconductor chip and a lead as an electrode of a lead frame with a wire as a thin metal wire are widely used in a manufacturing process of semiconductor devices. Such wire-bonding apparatuses typically employ a method of sequentially bonding between a pad and a lead with a wire by forming a tip end of the wire that is inserted through a capillary and extends from a tip of the capillary into an initial ball by, for example, sparking, moving the capillary down toward the pad and pressure-bonding the initial ball to the pad using the capillary tip thereby forming a pressure-bonded ball, moving the capillary upward and then toward the lead from the pressure-bonded ball while feeding the wire from the capillary tip thereby looping the wire, moving the capillary down toward the lead and pressure-bonding the wire to the lead using the capillary tip, moving the capillary upward to cut the wire, and then moving the capillary to a position of a pad to be processed next.

In order to connect a pad and a lead in a good condition using a wire-bonding apparatus, it is necessary to make a size of a pressure-bonded ball to be a predetermined designed value. This is because a pressure-bonded ball smaller than the designed value can often result in poor bonding and a pressure-bonded ball larger than the designed value can often cause the pressure-bonded ball to protrude from the pad and to be brought into contact with an adjacent pad.

However, the size of the pressure-bonded ball can often vary during bonding due to a heating temperature of a heat block of a bonding apparatus and such. Accordingly, it is required to detect the size of the pressure-bonded ball during bonding so as to confirm that the pressure-bonded ball is bonded at a designed size. Japanese Unexamined Patent Application Publication No. H07-297220 proposes a method of detecting edges of a pressure-bonded ball based on at least three directions of lines respectively connecting a central position of a pad and points within the pad and outside the pressure-bonded ball, and calculating a position, a size, and/or a shape of the pressure-bonded ball based on the three edges of the pressure-bonded ball.

As a size of pads has increasingly become smaller along with fine-pitching of devices in recent years, there are manufactured semiconductor devices in which a diameter of a wire that extends from the pad is substantially the same as that of a pressure-bonded ball. When acquiring an image, using a camera, of a pressure-bonded ball that has been pressure-bonded to a pad of such a semiconductor chip, almost a half of a circumference of an outer shape of the pressure-bonded ball is hidden under the wire that extends from the pressure-bonded ball, and it is not possible to detect its edge by image processing.

Therefore, in bonding for fine-pitch semiconductor chips in which the diameter of the pressure-bonded ball is substantially the same as that of the wire, the method of calculating the central position and the size of the pressure-bonded ball based on the central position of the pad and the three edges of the pressure-bonded ball as proposed by Japanese Unexamined Patent Application Publication No. H07-297220 poses a problem that it is often not possible to detect the coordinates of the edges depending on a position of the pad and a position of the pressure-bonded ball as the intersection point of an X axis and a Y axis that respectively passing the center of the pad and the edges of the pressure-bonded ball are covered with the wire, and thus the size and shape of the pressure-bonded ball is often difficult to detected.

BRIEF SUMMARY OF THE INVENTION

An object of the present invention is to improve detectability of a diameter of a pressure-bonded ball bonded by a bonding apparatus.

A pressure-bonded ball diameter detecting apparatus according to the present invention includes:

a camera for capturing:
  an image of each of rectangle-shaped pads of each of a first pad group and a second pad group that are provided on a surface of a semiconductor chip, the first pad group including the rectangle-shaped pads arranged along a short side direction of the pads and wires each extending from a pressure-bonded ball that is bonded to each rectangle-shaped pad and across a short side of the corresponding rectangle-shaped pad, the second pad group facing toward the first pad group in a long side direction of the rectangle-shaped pads and including the rectangle-shaped pads arranged along the short side direction of the pads and wires each extending from a pressure-bonded ball that is bonded to each rectangle-shaped pad toward a direction opposite of a direction to which each wire of the first pad group extends; and
  an image of each pressure-bonded ball bonded to each rectangle-shaped pad of the semiconductor chip by a bonding apparatus; and an image processing unit connected to the bonding apparatus and for processing the images captured with the camera, the image processing unit being configured to include:
  outline acquiring means for acquiring, from each image captured with the camera, an outline of each pressure-bonded ball and an outline of a short side of each pad, the side being opposite of a direction to which each wire extends from the corresponding pressure-bonded ball;
  bonding-control-center position acquiring means for acquiring, from the bonding apparatus, a bonding-control-center position of each pressure-bonded ball; and
  pressure-bonded ball diameter calculating means for calculating a diameter of the pressure-bonded balls by calculating first tentative radii and second tentative radii and averaging the first tentative radii and the second tentative radii of the same number, each first tentative radius being obtained by subtracting a distance in a longitudinal direction of the pads between the outline of the short side of one of the pads included in the first pad group and the outline of the corresponding pressure-bonded ball from a distance in the longitudinal direction of the pads between the outline of the short side of the pad included in the first pad group and the bonding-control-center position of the corresponding pressure-bonded ball, each second tentative radius being obtained by subtracting a distance in the longitudinal direction of the pads between the outline of the short side of one of the pads included in the second pad group and the outline of the corresponding pressure-bonded ball from a distance in the longitudinal direction of the pads between the outline of the short side of the pad included in the second pad group and the bonding-control-center position of the corresponding pressure-bonded ball.

A pressure-bonded ball diameter detecting method according to the present invention includes:

an image capturing step of capturing, using a camera, an image of each of rectangle-shaped pads of each of a first pad group and a second pad group that are provided on a surface of a semiconductor chip, the first pad group including the rectangle-shaped pads arranged along a short side direction of the pads and wires each extending from a pressure-bonded ball that is bonded to each rectangle-shaped pad and across a short side of the corresponding rectangle-shaped pad, the second pad group facing toward the first pad group in a long side direction of the rectangle-shaped pads and including the rectangle-shaped pads arranged along the short side direction of the pads and wires each extending from a pressure-bonded ball that is bonded to each rectangle-shaped pad toward a direction opposite of a direction to which each wire of the first pad group extends, and an image of each pressure-bonded ball bonded to each rectangle-shaped pad of the semiconductor chip by a bonding apparatus;

an outline acquiring step of acquiring, from each image captured with the camera, an outline of each pressure-bonded ball and an outline of a short side of each pad, the side being opposite of a direction to which each wire extends from the corresponding pressure-bonded ball;

a bonding-control-center position acquiring step of acquiring, from the bonding apparatus, a bonding-control-center position of each pressure-bonded ball; and a pressure-bonded ball diameter calculating step of calculating a diameter of the pressure-bonded balls by calculating first tentative radii and second tentative radii and averaging the first tentative radii and the second tentative radii of the same number, each first tentative radius being obtained by subtracting a distance in a longitudinal direction of the pads between the outline of the short side of one of the pads included in the first pad group and the outline of the corresponding pressure-bonded ball from a distance in the longitudinal direction of the pads between the outline of the short side of the pad included in the first pad group and the bonding-control-center position of the corresponding pressure-bonded ball, each second tentative radius being obtained by subtracting a distance in the longitudinal direction of the pads between the outline of the short side of one of the pads included in the second pad group and the outline of the corresponding pressure-bonded ball from a distance in the longitudinal direction of the pads between the outline of the short side of the pad included in the second pad group and the bonding-control-center position of the corresponding pressure-bonded ball.

The present invention provides an advantageous effect of improving detectability of a diameter of a pressure-bonded ball bonded by a bonding apparatus.

BRIEF DESCRIPTION OF THE SEVERAL VIEWS OF THE DRAWINGS

Exemplary embodiments of the present invention will be described in detail based on the following figures, wherein.

DETAILED DESCRIPTION OF THE INVENTION

Figure 1:
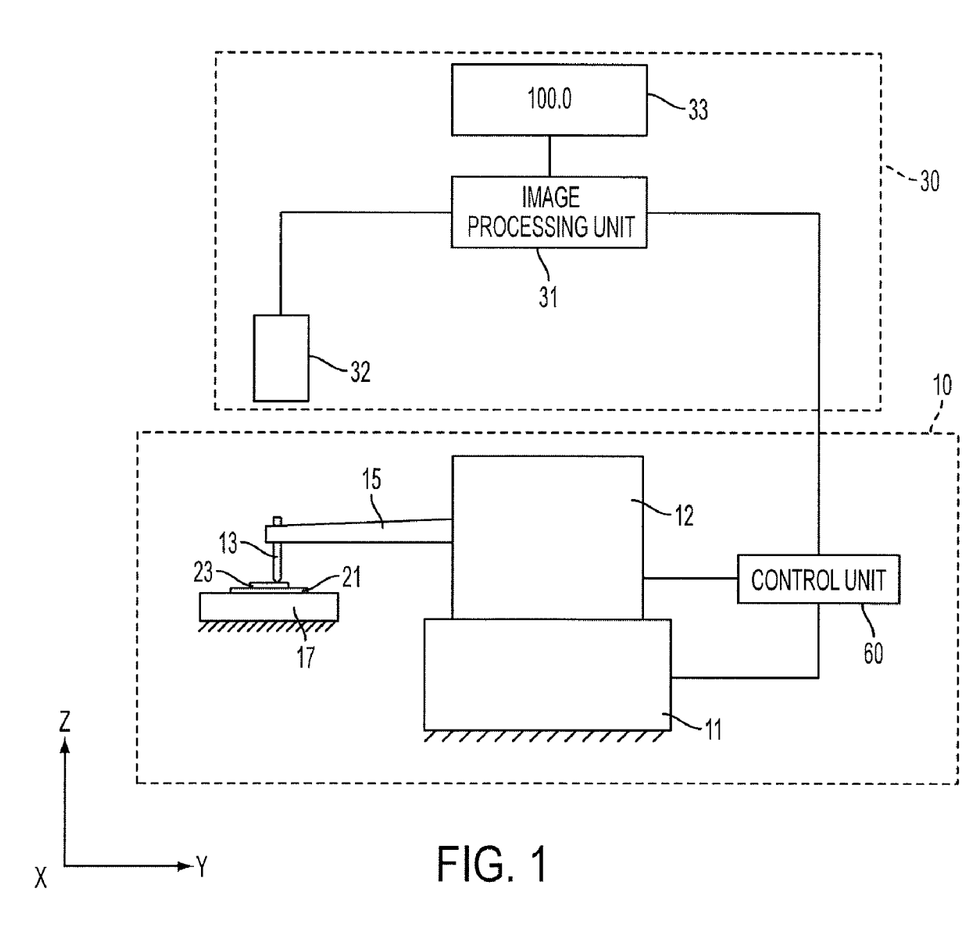
FIG. 1 is an illustrative diagram showing a structure of a pressure-bonded ball diameter detecting apparatus of an exemplary embodiment according to the present invention.

Exemplary embodiments according to the present invention will be described below with reference to the accompanying drawings. Referring to FIG. 1, a pressure-bonded ball diameter detecting apparatus 30 according to this exemplary embodiment is provided with a camera 32 that acquires an image of a pad of a fine-pitch semiconductor chip 23 and a pressure-bonded ball that has been bonded to the pad, an image processing unit 31 that processes the image acquired with the camera 32, and a display unit 33 that is connected to the image processing unit 31 and displays a diameter of the pressure-bonded ball. Further, a wire-bonding apparatus 10 that bonds a wire to the fine-pitch semiconductor chip 23 to form the pressure-bonded ball on the pad by is provided with a bonding stage 17 that suction-fixes a substrate 21 to which the semiconductor chip 23 is mounted, a bonding arm 15 to which a capillary 13 is attached at a tip of the arm, and a bonding head 12 provided with a Z motor that is not shown in the drawing and that drives the bonding arm 15 such that the capillary 13 attached to the tip of the arm moves in an approaching and retreating direction with respect to the semiconductor chip 23, an X-Y table 11 that freely moves the bonding head 12 in an X direction and a Y direction, and a control unit 60 that controls the movement of the bonding head 12 and the X-Y table 11. The control unit 60 forms the wire that extends from a tip of the capillary 13 into an initial ball by, for example, a discharge flame off that is not shown in the drawing, sets a central position of the capillary 13 to be aligned with a bonding position of the pad with the X-Y table 11, and drives the Z motor of the bonding head to pressure-bond the initial ball onto the pad, thereby forming the pressure-bonded ball.

The camera 32 is provided with an optical system including a lens and such, and an imaging area such as a CCD that converts an image formed by the optical system into electrical signals, and connected to the image processing unit 31. The image processing unit 31 is configured by a computer including such as a CPU and a memory therein. Further, the display unit 33 provides a numerical display of a diameter of the pressure-bonded ball using such as an LED. The control unit 60 of the wire-bonding apparatus 10 is also configured by a computer including such as a CPU and a memory therein. The image processing unit 31 and the control unit 60 are connected via a signal circuit such as a data bus.

Figure 2:
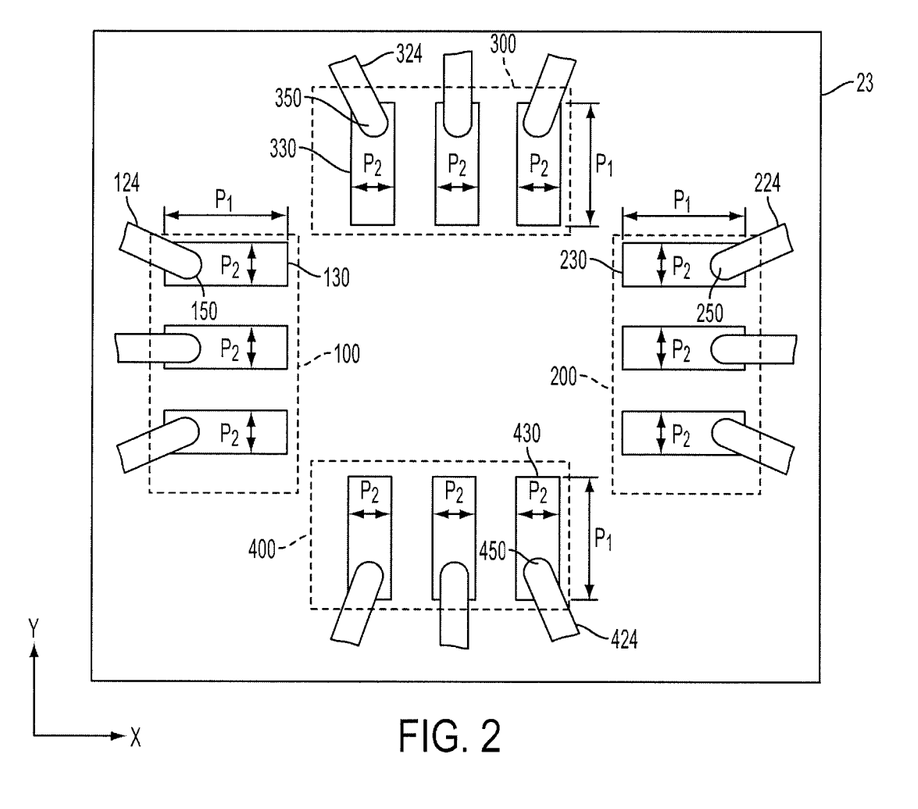
FIG. 2 is a plan view showing a semiconductor device bonded by a wire-bonding apparatus to which the pressure-bonded ball diameter detecting apparatus of an exemplary embodiment according to the present invention is connected.

Referring to FIG. 2, the semiconductor chip 23 to which the wire is bonded by the wire-bonding apparatus 10 includes a first pad group 100 in which rectangle-shaped pads 130 are arranged along a short side direction of the pads and wires 124 each extend from a pressure-bonded ball 150 that is bonded to each of the rectangle-shaped pads 130 across a short side of the corresponding rectangle-shaped pad 130, and a second pad group 200 in which rectangle-shaped pads 230 are arranged along the short side direction of the pads and wires 224 each extend from a pressure-bonded ball 250 that is bonded to each of the rectangle-shaped pads 230 across a short side of the corresponding rectangle-shaped pad 230. The semiconductor chip 23 also includes a third pad group 300 in which rectangle-shaped pads 330 are arranged along a short side direction of the pads and wires 324 each extend from a pressure-bonded ball 350 that is bonded to each of the rectangle-shaped pads 330 across a short side of the corresponding rectangle-shaped pad 330, and a fourth pad group 400 in which rectangle-shaped pads 430 are arranged along the short side direction of the pads and wires 424 each extend from a pressure-bonded ball 450 that is bonded to each of the rectangle-shaped pads 430 across a short side of the corresponding rectangle-shaped pad 430.

The first pad group 100 and the second pad group 200 respectively include the three rectangle-shaped pads 130 and the three rectangle-shaped pads 230 that are arranged such that long sides of the rectangle-shaped pads 130 and 230 are aligned along the X direction and the short sides are aligned along the Y direction. The first pad group 100 and the second pad group 200 are disposed on a surface of the semiconductor chip on both sides in the X direction, which is a long side direction of the rectangle-shaped pads 130 and 230, so as to face toward each other in the X direction. All of the rectangle-shaped pads 130 and 230 respectively included in the first pad group 100 and the second pad group 200 are in the same size whose length along the long side is $P_1$ and whose length along the short side is $P_2$. The length $P_1$ along the long side corresponds to a length that allows bonding on one end and probing on the other end of the pad, and the length $P_2$ along the short side corresponds to a length that addresses the fine-pitch. Each of the wires 124 extending from the respective pressure-bonded balls 150 bonded to the rectangle-shaped pads 130 of the first pad group 100 extends toward a negative side in the X direction across the short side of the corresponding rectangle-shaped pad 130 on the negative side in the X direction (a left side in FIG. 2). The wire 124 extending from the rectangle-shaped pad 130 in the middle of the three pads extends substantially along the long side direction of the rectangle-shaped pad 130, and each of the wires 124 extending from the rectangle-shaped pads 130 on both sides of the middle pad extends at an angle with respect to the long side direction of the rectangle-shaped pad 130. Each of the wires 224 extending from the respective pressure-bonded balls 250 bonded to the rectangle-shaped pads 230 of the second pad group 200 extends toward a positive side in the X direction across the short side of the corresponding rectangle-shaped pad 230 on the positive side in the X direction (a right side in FIG. 2). The wire 224 extending from the rectangle-shaped pad 230 in the middle of the three pads extends substantially along the long side direction of the rectangle-shaped pad 230, and each of the wires 224 extending from the rectangle-shaped pads 230 on both sides of the middle pad extends at an angle with respect to the long side direction of the rectangle-shaped pad 230. In this manner, each wire 124 of the first pad group 100 and each wire 224 of the second pad group 200 extend respectively in opposite directions with respect to the X direction.

The third pad group 300 and the fourth pad group 400 respectively include the three pads 330 and the three pads 430 that are arranged such that long sides of the rectangle-shaped pads 330 and 430 are aligned along the Y direction and the short sides are aligned along the X direction. The third pad group 300 and the fourth pad group 400 are disposed on a surface of the semiconductor chip on both sides in the Y direction, which is a long side direction of the rectangle-shaped pads 330 and 430, so as to face toward each other in the Y direction. All of the rectangle-shaped pads 330 and 430 respectively included in the third pad group 300 and the fourth pad group 400 are in the same size whose length along the long side is $P_1$ and whose length along the short side is $P_2$, similarly to the rectangle-shaped pads 130 and 230. Each of the wires 324 extending from the respective pressure-bonded balls 350 bonded to the rectangle-shaped pads 330 of the third pad group 300 extends toward a positive side in the Y direction across the short side of the corresponding rectangle-shaped pad 330 on the positive side in the Y direction. The wire 324 extending from the rectangle-shaped pad 330 in the middle of the three pads extends substantially along the long side direction of the rectangle-shaped pad 330, and each of the wires 324 extending from the rectangle-shaped pads 330 on both sides of the middle pad extends at an angle with respect to the long side direction of the rectangle-shaped pad 330. Each of the wires 424 extending from the respective pressure-bonded balls 450 bonded to each rectangle-shaped pads 430 of the fourth pad group 400 extends toward a negative side in the Y direction across the short side of the corresponding rectangle-shaped pad 430 on the negative side in the Y direction. The wire 424 extending from the rectangle-shaped pad 430 in the middle of the three pads extends substantially along the long side direction of the rectangle-shaped pad 430, and each of the wires 424 extending from the rectangle-shaped pads 430 on both sides of the middle pad extends at an angle with respect to the long side direction of the rectangle-shaped pad 430. In this manner, each wire 324 of the third pad group 300 and each wire 424 of the fourth pad group 400 extend respectively in opposite directions with respect to the Y direction.

The following describes detection of diameters of the pressure-bonded balls 150 and 250 in the X direction of the semiconductor chip 23 to which the wire bonding has been finished as shown in FIG. 2, with reference to FIG. 3A, FIG. 3B, FIG. 4A, FIG. 4B, FIG. 5A, and FIG. 5B.

The CPU of the image processing unit 31 adjusts a position of the camera 32 so that the field of view of the camera 32 includes the rectangle-shaped pad 130 of the first pad group 100, and then outputs an instruction for acquiring an image. Based on this instruction, the image processing unit 31 acquires images of the rectangle-shaped pads 130 and the pressure-bonded balls 150 from the camera 32 and stores the acquired images in the memory.

Figure 3A:
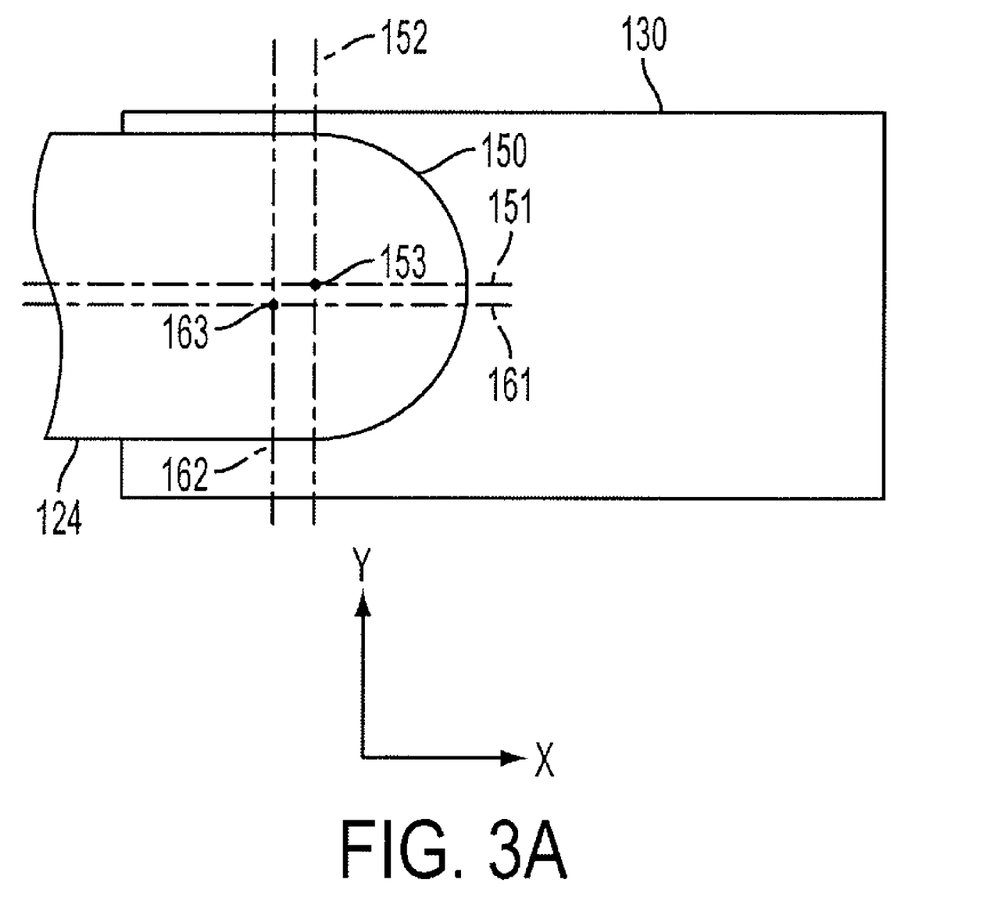
FIG. 3A is an illustrative diagram showing an image acquired with a camera of the pressure-bonded ball diameter detecting apparatus of an exemplary embodiment according to the present invention.

Referring to FIG. 3A, each acquired image includes the rectangle-shaped pad 130, the pressure-bonded ball 150 that pressure-bonded to the rectangle-shaped pad 130, and the wire 124 that extends from the pressure-bonded ball 150 toward the negative side in the X direction. The length $P_2$ along the short side of the rectangle-shaped pad 130 is small as the pad is disposed at a fine-pitch, and the diameter of the pressure-bonded ball 150 is also small so as to be contained within the short side of the rectangle-shaped pad 130. Therefore, the diameter of the pressure-bonded ball 150 is only slightly larger than that of the wire 124, and the short side of the rectangle-shaped pad 130 on the negative side in the X direction across which the wire 124 extends in the acquired image is mostly hidden under the wire 124 as shown in FIG. 3A.

Further, also shown in FIG. 3A, a central point 153 of the pressure-bonded ball 150 represented as an intersection point between a center line 151 along the X direction and a center line 152 along the Y direction is slightly displaced to the positive sides both in the X direction and the Y direction from a bonding control center 163 represented as an intersection point between a center line 161 along the X direction and a center line 162 in the Y direction and which is a position instructed to the X-Y table 11 from the control unit 60 of the wire-bonding apparatus 10.

The CPU of the image processing unit 31 outputs an instruction for processing the image stored in the memory and acquiring an outline of the rectangle-shaped pad 130 and an outline of the pressure-bonded ball 150. The CPU of the image processing unit 31 reads image data stored in the memory, carries out such as a digitizing process, for example, thereby recognizing and acquiring the outline of the rectangle-shaped pad 130 as lines representing the respective sides from the two-dimensional image, and acquiring the outline of the pressure-bonded ball 150 as a curving line.

Figure 4A:
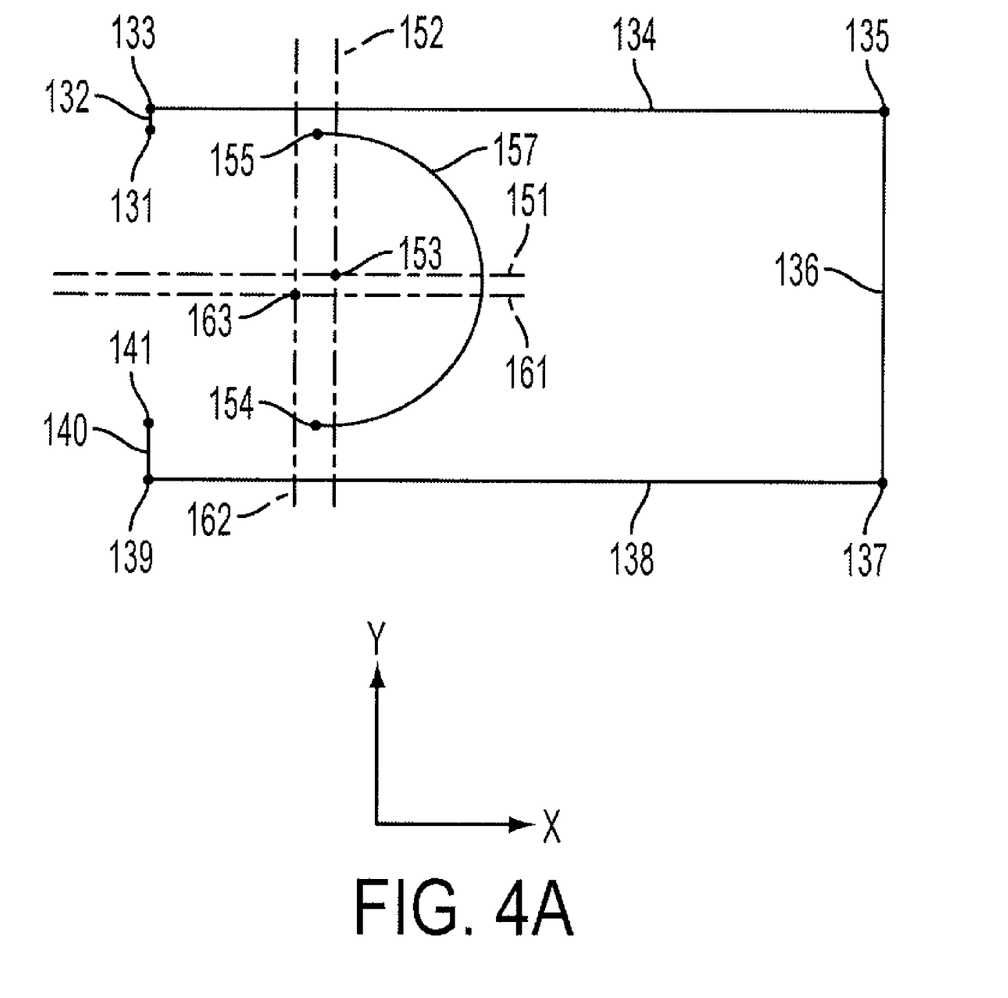
FIG. 4A is an illustrative diagram showing a line segment of a short side across which a wire does not extend of a rectangle-shaped pad, and a curving line of an outline of a pressure-bonded ball acquired by processing the image shown in FIG. 3A.

As shown in FIG. 4A, upon processing of the image, the four sides that define the rectangle-shaped pad 130 are acquired as five line segments including a line segment 132 between a point 131 and a point 133, a line segment 134 between the point 133 and a point 135, a line segment 136 between the point 135 and a point 137, a line segment 138 between the point 137 and a point 139, and a line segment 140 between the point 139 and a point 141. A portion between the point 131 and the point 141 is hidden under the wire 124 that extends from the pressure-bonded ball 150, and a height of this portion is different from that of a surface of the rectangle-shaped pad 130. In the image focused on the surface of the rectangle-shaped pad 130, a contrast in the portion relating to the wire 124 is low due to a focus error, and an outline cannot be acquired. Accordingly, it is not possible to recognize an outer line of this side by, for example, the digitizing process and a line segment for this portion is not acquired.

For the outline of the pressure-bonded ball 150, it is possible to acquire the outline by, for example, digitizing a high-contrast portion in the image focused on the surface of the rectangle-shaped pad 130. However, as the height of the portion for the wire 124 that extends from the pressure-bonded ball 150 is different from that of the surface of the rectangle-shaped pad 130, a contrast in the portion relating to the wire 124 is low due to a focus error in the image focused on the surface of the rectangle-shaped pad 130, and the outline cannot be acquired. Accordingly, the outline of the pressure-bonded ball 150 is acquired as a curving line 157 between a point 154 and a point 155 excluding a rising portion to the wire 124 as shown in FIG. 4A.

The CPU of the image processing unit 31 determines whether or not a line segment representing the side that extends along the Y direction and that is substantially as long as the short side of the rectangle-shaped pad 130, i.e., the short side that is opposite of the side across which the wire 124 extends is recognized in the acquired line segments 132, 134, 136, 138, and 140 representing the respective sides of the rectangle-shaped pad 130. If a line segment representing the side opposite of the side across which the wire 124 extends is not recognized in the acquired line segments, the CPU determines that it is not possible to calculate the diameter of the pressure-bonded ball 150 using the acquired line segments, moves the camera 32 to subsequent one of the rectangle-shaped pads 130 in the first pad group 100, and repeats the operation of acquiring the image and acquiring the line segments until the line segment representing the side of the rectangle-shaped pad 130 opposite of the side across which the wire 124 extends is acquired. In this exemplary embodiment, the line segment 136 is the line segment representing the short side opposite of the side across which the wire 124 extends, and the CPU of the image processing unit 31 recognizes that the line segment representing the short side opposite of the side across which the wire 124 extends is acquired.

Figure 5A:
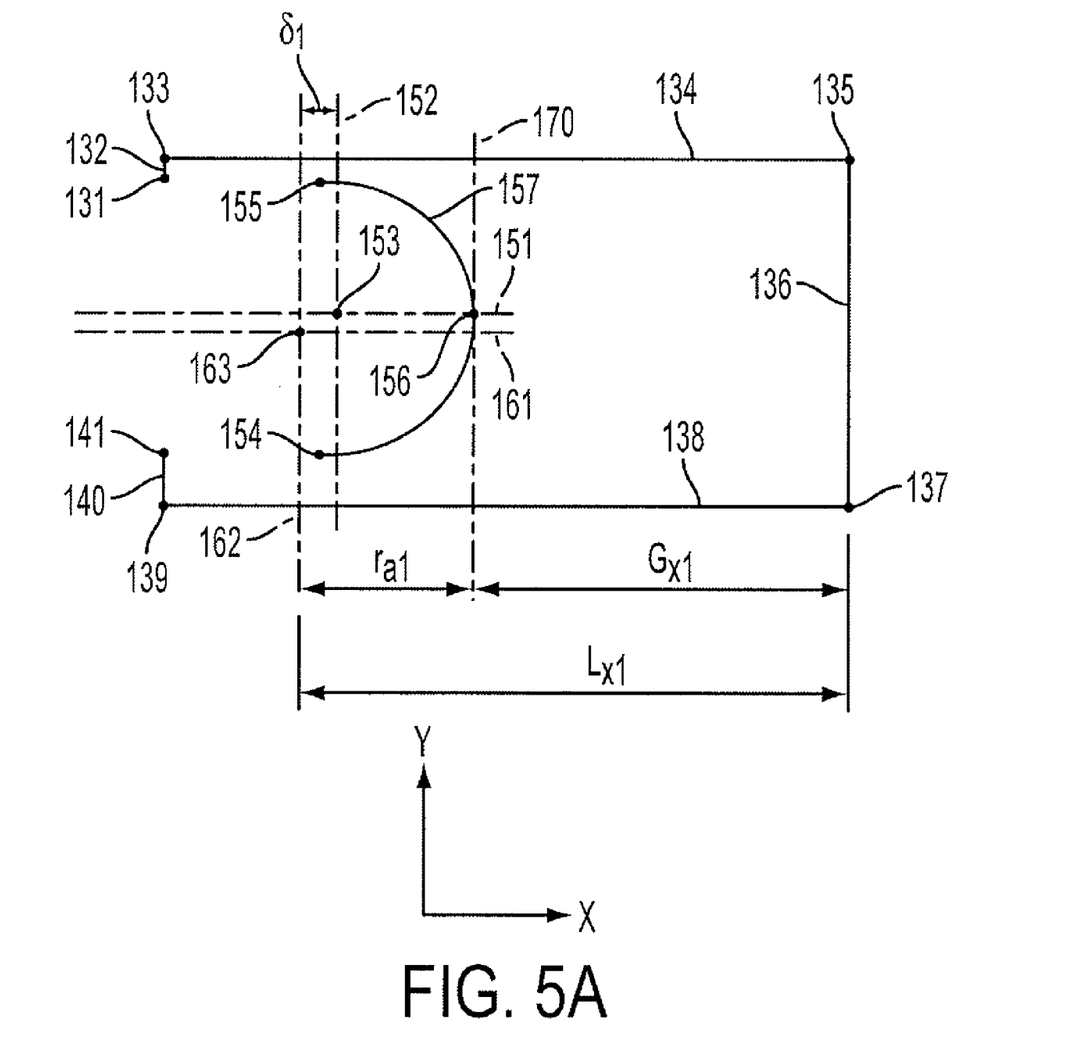
FIG. 5A is an illustrative diagram showing a distance between the line segment of the short side across which the wire does not extend of the rectangle-shaped pad shown in FIG. 4A, and the curving line of the outline of the pressure-bonded ball, a distance between the line segment of the short side across which the wire does not extend of the rectangle-shaped pad and a position of a bonding control center.

Then, as shown in FIG. 5A, the CPU of the image processing unit 31 sets a tangent line 170 that extends along the Y direction and is brought into contact with the curving line 157 representing the outline of the pressure-bonded ball 150. The setting of the tangent line 170 can be carried out by image processing in which a line segment that extends along the Y direction is moved in the X direction, and acquiring a line segment that passes through a point 156 where a number of intersection points between the line segment and the curving line 157 is reduced from two to one as the tangent line 170. Alternatively, it is possible to obtain the tangent line 170 by setting an approximate circular arc that represents the curving line assuming that the curving line 157 is a circular arc representing the outline of the pressure-bonded ball 150, and obtaining a line that passes the point 156 that is brought into contact with the approximate circular arc by calculation.

When the tangent line 170 is set, the CPU of the image processing unit 31 acquires a distance between the tangent line 170 and the line segment 136 as a distance $Gx_1$ between the outline of the pressure-bonded ball 150 and the outline of the short side of the rectangle-shaped pad 130 opposite of the side across which the wire 124 extends, and stores the distance $Gx_1$ in the memory.

The CPU of the image processing unit 31 acquires the position of the bonding control center 163 of the rectangle-shaped pad 130 that is being processed from the control unit 60 of the wire-bonding apparatus 10. The bonding control center 163 is acquired as numbers of pixels between the bonding control center 163 and the center of the acquired image both in the X direction and the Y direction. Then, the CPU of the image processing unit 31 acquires a distance $Lx_1$ between the bonding control center 163 and the line segment 136 by acquiring numbers of pixels between the bonding control center 163 and the line segment 136. The distance $Lx_1$ is a distance between the position of the bonding control center 163 and the outline of the short side of the rectangle-shaped pad 130 opposite of the side across which the wire 124 extends. Then, the CPU of the image processing unit 31 calculates a first tentative radius $ra_1$ by subtracting the distance $Gx_1$ from the distance the $Lx_1$. As shown in FIG. 5A, the first tentative radius $ra_1$ is a value acquired by adding an amount of displacement $\delta_1$ in the X direction between the central point 153 of the pressure-bonded ball 150 and the position of the bonding control center 163 to a radius of the pressure-bonded ball 150.

The image processing unit 31 repeats the operation as described above, and acquires a predetermined number of the first tentative radii $ra_1$ from the first pad group 100 and stores the first tentative radii $ra_1$ in the memory.

Figure 3B:
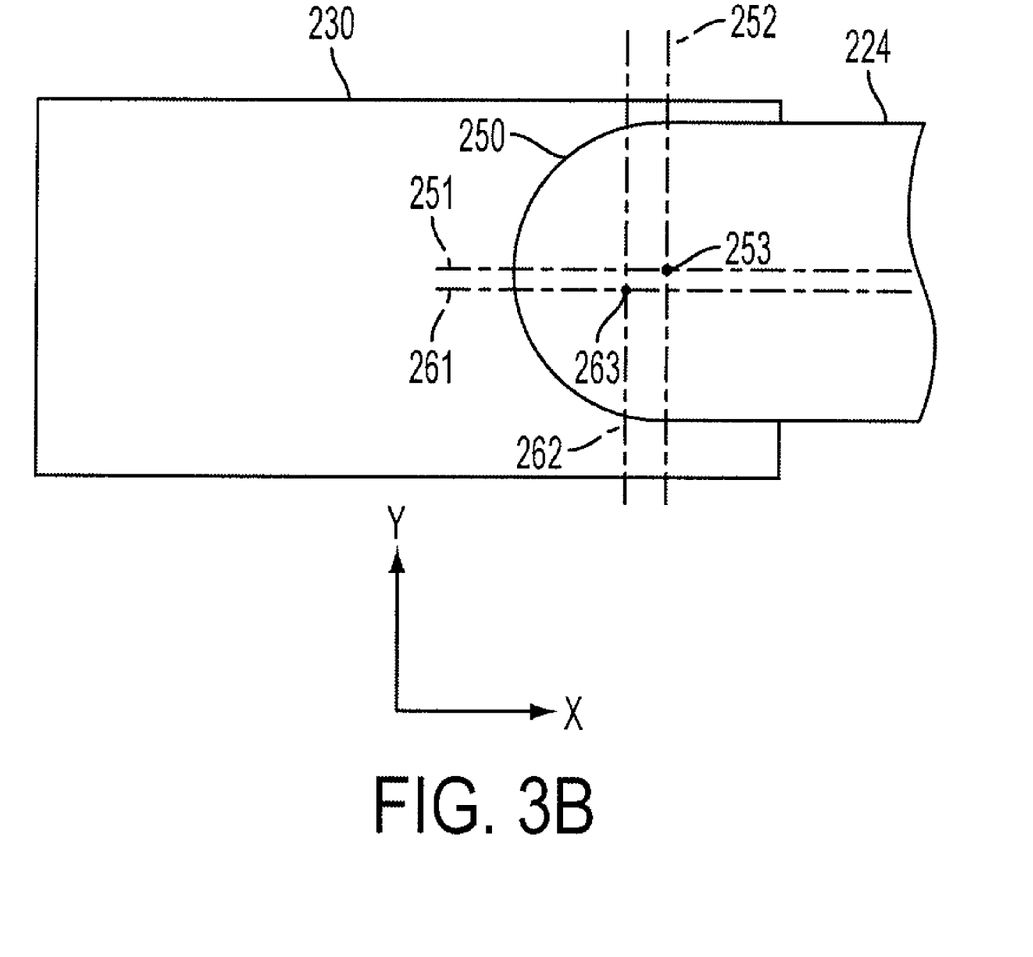
FIG. 3B is an illustrative diagram showing an image acquired with the camera of the pressure-bonded ball diameter detecting apparatus of an exemplary embodiment according to the present invention.
Figure 4B:
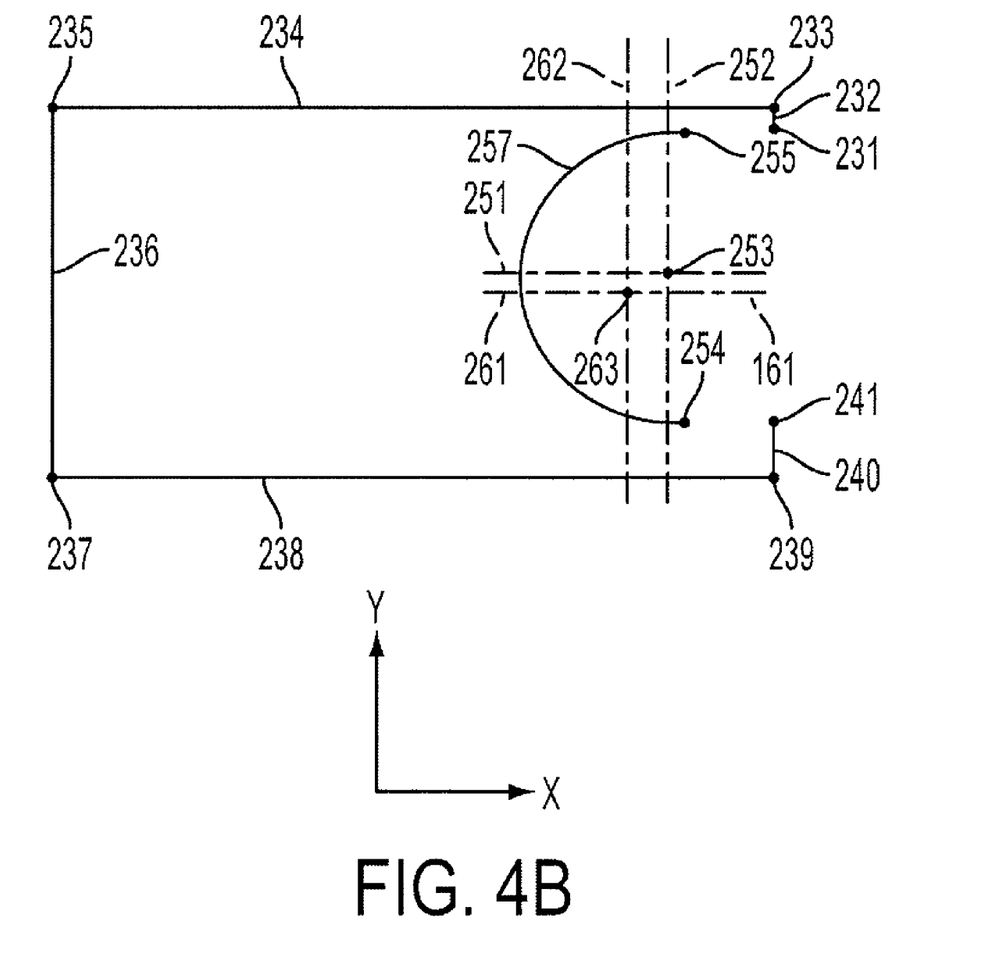
FIG. 4B is an illustrative diagram showing a line segment of a short side across which a wire does not extend of a rectangle-shaped pad, and a curving line of an outline of a pressure-bonded ball acquired by processing the image shown in FIG. 3B.

The image processing unit 31 acquires a second tentative radius $ra_2$ from the second pad group 200 in the same manner as in the acquiring of the first tentative radius $ra_1$ from the first pad group 100. The second tentative radius $ra_2$ is acquired from the second pad group 200 by the same method as previously described with reference to FIG. 3A, FIG. 4A, and FIG. 5A, and reference numerals for the rectangle-shaped pads, the points, and the line segments included in the second pad group 200 are read in the 200s as shown in FIG. 3B, FIG. 4B, and FIG. 5B.

Figure 5B:
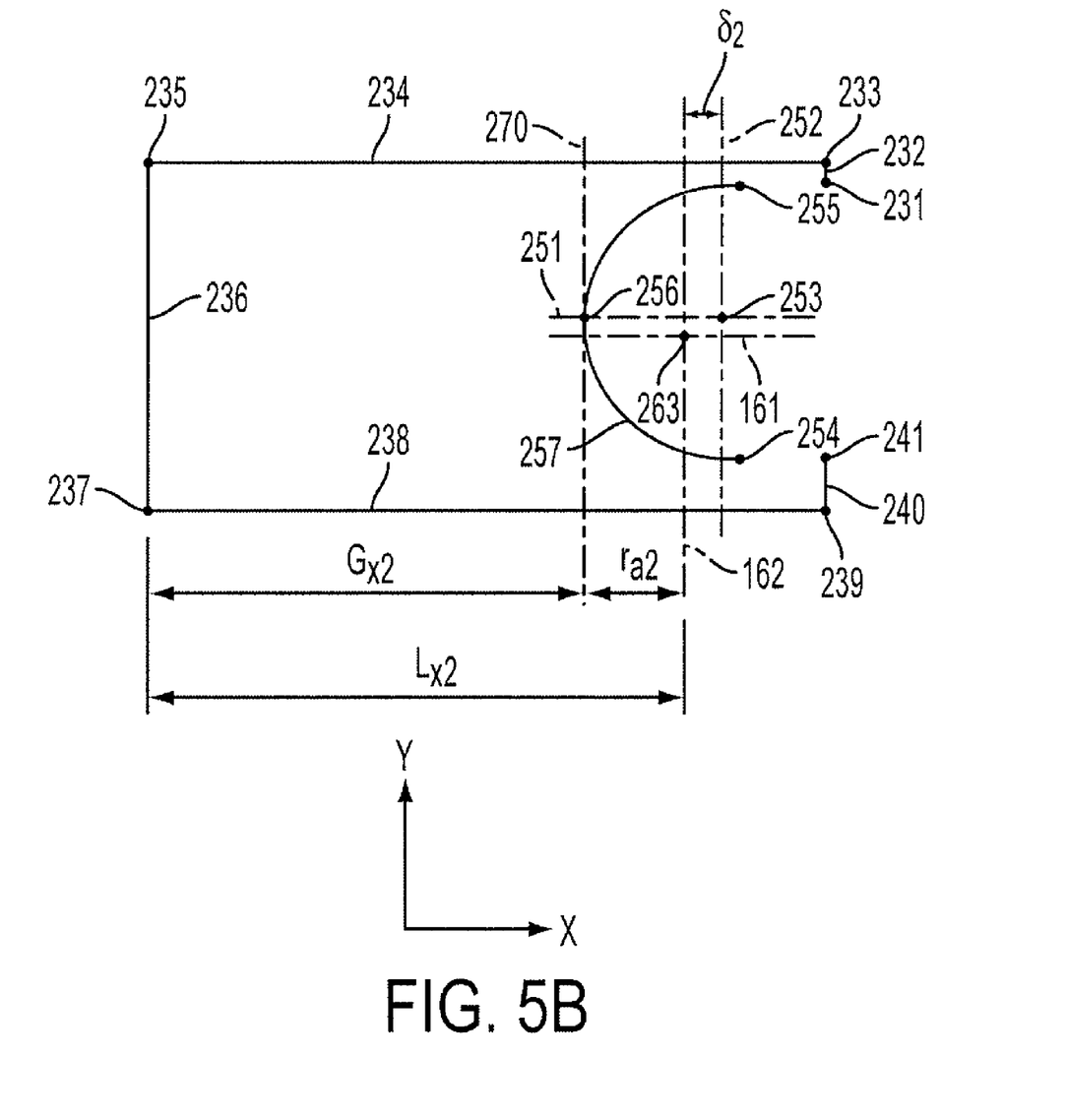
FIG. 5B is an illustrative diagram showing a distance between line segments of the short sides across which the wire does not extend of the rectangle-shaped pad shown in FIG. 4B, and the curving line of the outline of the pressure-bonded ball, a distance between line segments of the short sides across which the wire does not extend of the rectangle-shaped pad and a position of a bonding control center.

As shown in FIG. 5B, when a tangent line 270 is set, similarly to the case of the first pad group 100, the CPU of the image processing unit 31 acquires a distance between the tangent line 270 and a line segment 236 as a distance $Gx_2$ between the outline of the pressure-bonded ball 250 and the outline of the short side of the rectangle-shaped pad 230 opposite of the side across which the wire 224 extends, and stores the distance $Gx_2$ in the memory.

The CPU of the image processing unit 31 acquires a position of a bonding control center 263 of the rectangle-shaped pad 230 that is being processed from the control unit 60 of the wire-bonding apparatus 10, and acquires a distance $Lx_2$ between the bonding control center 263 and the line segment 236. The distance $Lx_2$ is a distance between the position of the bonding control center 263 and the outline of the short side of the rectangle-shaped pad 230 opposite of the side across which the wire 224 extends. Then, the CPU of the image processing unit 31 calculates the second tentative radius $ra_2$ by subtracting the distance $Gx_2$ from the distance $Lx_2$. As shown in FIG. 5B, the second tentative radius $ra_2$ is a value acquired by subtracting an amount of displacement $\delta_2$ in the X direction between a central point 253 of the pressure-bonded ball 250 and the position of the bonding control center 263 from a radius of the pressure-bonded ball 250.

The image processing unit 31, similarly to the case of the first pad group 100, acquires a predetermined number of the second tentative radii $ra_2$ from the second pad group 200 and stores the second tentative radii $ra_2$ in the memory.

The CPU of the image processing unit 31 reads the first tentative radii $ra_1$ and the second tentative radii $ra_2$ of the same number from the memory and calculates an average of these values. The first tentative radius $ra_1$ is a value acquired by adding an amount of displacement $\delta_1$ in the X direction between the central point 153 of the pressure-bonded ball 150 and the position of the bonding control center 163 to a radius of the pressure-bonded ball 150, and the second tentative radius $ra_2$ is a value acquired by subtracting an amount of displacement $\delta_2$ in the X direction between a central point 253 of the pressure-bonded ball 250 and the position of the bonding control center 263 from a radius of the pressure-bonded ball 250. In the wire-bonding apparatus 10, as the amount of displacement 5 is substantially the same as the amount of displacement $\delta_2$, calculating the average of the first tentative radii $ra_1$ and the second tentative radii $ra_1$ of the same number can offset the amount of displacement 5 and the amount of displacement $\delta_2$, and whereby an average radius of the pressure-bonded balls 150 and 250 in the X direction is obtained. Then, the image processing unit 31 doubles the obtained average radius of the pressure-bonded balls 150 and 250 in the X direction, and displays the doubled value on the display unit 33 of the pressure-bonded ball diameter detecting apparatus 30 as a diameter of the pressure-bonded balls 150 and 250 in the X direction.

In the same manner as described above, the image processing unit 31 obtains an average radius of the pressure-bonded balls 350 and 450 in the Y direction from the third pad group 300 and the fourth pad group 400, doubles the obtained average radius, and displays the doubled value in the display unit 33 as a diameter in the Y direction.

According to the exemplary embodiment as described above, it is possible to obtain the average diameter of the pressure-bonded balls 150-450 based on the distances respectively between the short sides of the rectangle-shaped pads 130-430 opposite of the sides across which the wires 124-424 extend and the outlines of the pressure-bonded balls 150-450 as well as the distances respectively between the bonding control centers 163-463 and the short sides of the rectangle-shaped pads 130-430 opposite of the sides across which the wires 124-424 extend, without obtaining the central positions of the pressure-bonded balls 150-450. Therefore, the exemplary embodiment described above provides an advantageous effect of improving detectability of the diameters of the pressure-bonded balls 150-450 in bonding for fine-pitch semiconductor in which the diameters of the pressure-bonded balls 150-450 are substantially the same as those of the wires 124-424.

According to the exemplary embodiment described above, the pressure-bonded ball diameter detecting apparatus 30 includes the camera 32 that is separately provided. However, it is possible to use a camera provided for the wire-bonding apparatus 10 as the camera 32. Further, according to the exemplary embodiment described above, an image of each rectangle-shaped pad and each pressure-bonded ball is sequentially taken and the first tentative radius $ra_1$ and the second tentative radius $ra_2$ are obtained. However, it is possible to acquire an image of the plurality of rectangle-shaped pads 130 and 230 and the pressure-bonded balls 150 and 250 included in the first pad group 100 and the second pad group 200, carry out the image processing at the same time, for example, and calculate the first tentative radius $ra_1$ and the second tentative radius $ra_2$.

The above exemplary embodiment describes the detection of the diameter of the pressure-bonded ball formed by the wire-bonding apparatus 10. However, the present invention can be applied to detection of a diameter of a pressure-bonded ball formed by any type of bonding apparatuses such as a bump bonding apparatus, in addition to the pressure-bonded ball formed by the wire-bonding apparatus 10.

The foregoing description of the exemplary embodiments of the present invention has been provided for the purpose of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention from various embodiments and with the various modifications as are suited to the particular use contemplated. It is intended that the scope of the invention be defined by the following claims and their equivalents.

What is claimed is:

1. A pressure-bonded ball diameter detecting apparatus, comprising:
   a camera for capturing:
   an image of each of rectangle-shaped pads of each of a first pad group and a second pad group that are provided on a surface of a semiconductor chip, the first pad group including the rectangle-shaped pads arranged along a short side direction of the pads and wires each extending from a pressure-bonded ball that is bonded to each rectangle-shaped pad and across a short side of the corresponding rectangle-shaped pad, the second pad group facing toward the first pad group in a long side direction of the rectangle-shaped pads and including the rectangle-shaped pads arranged along the short side direction of the pads and wires each extending from a pressure-bonded ball that is bonded to each rectangle-shaped pad toward a direction opposite of a direction to which each wire of the first pad group extends; and an image of each pressure-bonded ball bonded to each rectangle-shaped pad of the semiconductor chip by a bonding apparatus; and an image processing unit connected to the bonding apparatus and for processing the images captured with the camera, the image processing unit being configured to include:

outline acquiring means for acquiring, from each image captured with the camera, an outline of each pressure-bonded ball and an outline of a short side of each pad, the side being opposite of a direction to which each wire extends from the corresponding pressure-bonded ball;

bonding-control-center position acquiring means for acquiring, from the bonding apparatus, a bonding-control-center position of each pressure-bonded ball; and pressure-bonded ball diameter calculating means for calculating a diameter of the pressure-bonded balls by calculating first tentative radii and second tentative radii and averaging the first tentative radii and the second tentative radii of the same number, each first tentative radius being obtained by subtracting a distance in a longitudinal direction of the pads between the outline of the short side of one of the pads included in the first pad group and the outline of the corresponding pressure-bonded ball from a distance in the longitudinal direction of the pads between the outline of the short side of the pad included in the first pad group and the bonding-control-center position of the corresponding pressure-bonded ball, each second tentative radius being obtained by subtracting a distance in the longitudinal direction of the pads between the outline of the short side of one of the pads included in the second pad group and the outline of the corresponding pressure-bonded ball from a distance in the longitudinal direction of the pads between the outline of the short side of the pad included in the second pad group and the bonding-control-center position of the corresponding pressure-bonded ball.

2. A pressure-bonded ball diameter detecting method, comprising:

an image capturing step of capturing, using a camera, an image of each of rectangle-shaped pads of each of a first pad group and a second pad group that are provided on a surface of a semiconductor chip, the first pad group including the rectangle-shaped pads arranged along a short side direction of the pads and wires each extending from a pressure-bonded ball that is bonded to each rectangle-shaped pad and across a short side of the corresponding rectangle-shaped pad, the second pad group facing toward the first pad group in a long side direction of the rectangle-shaped pads and including the rectangle-shaped pads arranged along the short side direction of the pads and wires each extending from a pressure-bonded ball that is bonded to each rectangle-shaped pad toward a direction opposite of a direction to which each wire of the first pad group extends, and an image of each pressure-bonded ball bonded to each rectangle-shaped pad of the semiconductor chip by a bonding apparatus;

an outline acquiring step of acquiring, from each image captured with the camera, an outline of each pressure-bonded ball and an outline of a short side of each pad, the side being opposite of a direction to which each wire extends from the corresponding pressure-bonded ball;

a bonding-control-center position acquiring step of acquiring, from the bonding apparatus, a bonding-control-center position of each pressure-bonded ball; and a pressure-bonded ball diameter calculating step of calculating a diameter of the pressure-bonded balls by calculating first tentative radii and second tentative radii and averaging the first tentative radii and the second tentative radii of the same number, each first tentative radius being obtained by subtracting a distance in a longitudinal direction of the pads between the outline of the short side of one of the pads included in the first pad group and the outline of the corresponding pressure-bonded ball from a distance in the longitudinal direction of the pads between the outline of the short side of the pad included in the first pad group and the bonding-control-center position of the corresponding pressure-bonded ball, each second tentative radius being obtained by subtracting a distance in the longitudinal direction of the pads between the outline of the short side of one of the pads included in the second pad group and the outline of the corresponding pressure-bonded ball from a distance in the longitudinal direction of the pads between the outline of the short side of the pad included in the second pad group and the bonding-control-center position of the corresponding pressure-bonded ball.

* * * * *